(12) United States Patent
Van Santen et al.

(10) Patent No.: US 9,684,250 B2
(45) Date of Patent: Jun. 20, 2017

(54) LITHOGRAPHIC APPARATUS AND DEVICE MANUFACTURING METHOD

(71) Applicant: ASML NETHERLANDS B.V., Veldhoven (NL)

(72) Inventors: Helmar Van Santen, Amsterdam (NL); Aleksey Kolesnychenko, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/287,547

(22) Filed: Oct. 6, 2016

(65) Prior Publication Data

US 2017/0023871 A1 Jan. 26, 2017

Related U.S. Application Data

(63) Continuation of application No. 14/311,723, filed on Jun. 23, 2014, now Pat. No. 9,465,301, which is a continuation of application No. 12/727,456, filed on Mar. 19, 2010, now Pat. No. 8,767,171, which is a continuation of application No. 11/882,292, filed on Jul. 31, 2007, now Pat. No. 7,710,541, which is a continuation of application No. 10/743,271, filed on Dec. 23, 2003, now Pat. No. 7,394,521.

(51) Int. Cl.
*G03B 27/52* (2006.01)
*G03B 27/42* (2006.01)
*G03F 7/20* (2006.01)

(52) U.S. Cl.
CPC ...... *G03F 7/70866* (2013.01); *G03F 7/70341* (2013.01)

(58) Field of Classification Search
CPC ...... G03F 7/20; G03F 7/2041; G03F 7/70058; G03F 7/70341; G03F 7/70641
See application file for complete search history.

(56) References Cited

U.S. PATENT DOCUMENTS

| | | |
|---|---|---|
| 3,573,975 A | 4/1971 | Dhaka et al. |
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

United States Office Action issued for U.S. Appl. No. 11/473,147, dated Mar. 20, 2007.

(Continued)

*Primary Examiner* — Mesfin Asfaw
(74) *Attorney, Agent, or Firm* — Pillsbury Winthrop Shaw Pittman LLP (57) ABSTRACT

A liquid supply system for an immersion lithographic projection apparatus is disclosed in which a space is defined between the projection system, a barrier member and a substrate. The barrier member is not sealed such that, during use, immersion liquid is allowed to flow out the space and between the barrier member and the substrate.

20 Claims, 3 Drawing Sheets

(56) References Cited

U.S. PATENT DOCUMENTS

| | | | |
|---|---|---|---|
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,121,256 A | 6/1992 | Corle et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,665,046 B2 | 12/2003 | Nogawa et al. | |
| 6,781,668 B2 | 8/2004 | Schuster et al. | |
| 6,788,477 B2 | 9/2004 | Lin | |
| 6,809,794 B1 | 10/2004 | Sewell | |
| 6,867,844 B2 | 3/2005 | Vogel et al. | |
| 6,952,253 B2 | 10/2005 | Lof et al. | |
| 7,050,146 B2 | 5/2006 | Duineveld et al. | |
| 7,075,616 B2 | 7/2006 | Derksen et al. | |
| 7,081,943 B2 | 7/2006 | Lof et al. | |
| 7,130,037 B1 | 10/2006 | Lange | |
| 7,326,522 B2 | 2/2008 | Dierichs | |
| 2001/0006412 A1 | 7/2001 | Karl-Heinz et al. | |
| 2002/0020821 A1 | 2/2002 | Van Santen et al. | |
| 2002/0109823 A1 | 8/2002 | Binnard et al. | |
| 2002/0163629 A1 | 11/2002 | Switkes et al. | |
| 2003/0030916 A1 | 2/2003 | Suenaga | |
| 2003/0081191 A1 | 5/2003 | Nishi et al. | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik et al. | |
| 2004/0135099 A1 | 7/2004 | Simon et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0046934 A1 | 3/2005 | Ho et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0190455 A1 | 9/2005 | Rostalski et al. | |
| 2005/0217135 A1 | 10/2005 | O'Donnell | |
| 2005/0217137 A1 | 10/2005 | Smith et al. | |
| 2005/0217703 A1 | 10/2005 | O'Donnell | |
| 2005/0231694 A1 | 10/2005 | Kolesnychenko et al. | |
| 2005/0259234 A1 | 11/2005 | Hirukawa et al. | |
| 2005/0264774 A1 | 12/2005 | Mizutani et al. | |
| 2006/0023182 A1 | 2/2006 | Noval et al. | |
| 2006/0238730 A1 | 10/2006 | Nei et al. | |
| 2008/0309891 A1* | 12/2008 | Chang | G03F 7/70341 355/30 |
| 2010/0279232 A1* | 11/2010 | Dziomkina | G03B 27/58 430/322 |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 0 834 773 A2 | 4/1998 |
| EP | 1039511 | 9/2000 |
| EP | 1 420 299 | 5/2004 |
| FR | 2474708 | 7/1981 |
| JP | A 57-153433 | 9/1982 |
| JP | 58-202448 | 11/1983 |
| JP | A 59-19912 | 2/1984 |
| JP | 61-187984 | 8/1986 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 5-62877 | 3/1993 |
| JP | A 05-304072 | 11/1993 |
| JP | 06-124873 | 5/1994 |
| JP | A 06-168866 | 6/1994 |
| JP | A 06-181157 | 6/1994 |
| JP | 07-132262 | 5/1995 |
| JP | 07-220990 | 8/1995 |
| JP | A 8-316125 | 11/1996 |
| JP | 9-192661 | 7/1997 |
| JP | A 10-116760 | 5/1998 |
| JP | A 10-154659 | 6/1998 |
| JP | 10-228661 | 8/1998 |
| JP | 10-255319 | 9/1998 |
| JP | 10-303114 | 11/1998 |
| JP | 10-340846 | 12/1998 |
| JP | 11-036837 | 2/1999 |
| JP | A 11-166990 | 6/1999 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-259966 | 9/2004 |
| JP | 2005-101488 | 4/2005 |
| JP | WO 2005/041276 A1 | 5/2005 |
| JP | 2005-277363 | 10/2005 |
| WO | WO 99/49504 | 9/1999 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |

(56) References Cited

FOREIGN PATENT DOCUMENTS

| WO | WO 2004/057590 A1 | 7/2004 |
|---|---|---|
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

Information Disclosure Statemnt for U.S. Appl. No. 11/473,147, filed Jun. 23, 2006.
Japanese Office Action issued for Japanese Patent Application No. 2006-545996, dated Jul. 18, 2007.
Chinese Office Action for Chinese Patent Application No. 200480038343.1 dated Jun. 20, 208.
International Search Report for International Application No. PCT/JP99/01262 dated Jun. 15, 1999.
Notice of Reasons for Rejection for Japanese Patent Application No. 2008-062774 dated Apr. 2, 2009.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lighography", SPIE vol. 922, Optical/Laser Microlithograph (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", FUTURE FAB International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "1/8 µm Optical Lithography", J. Vac. Sci. Technol. B., vol. 10, No. 6, Nov./Dec. 1992, pp. 3032-3036.
European Search Report dated Nov. 8, 2010 in related European patent application No. 10180289.0-1226.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).
H. Hogan, "New Semiconductor Lithography Makes a Splash", PHOTONICS SPECTRA, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.

* cited by examiner

Fig. 2

(PRIOR ART)

Fig. 3

(PRIOR ART)

Fig. 4

LITHOGRAPHIC APPARATUS AND DEVICE MANUFACTURING METHOD

The present application is a continuation of U.S. patent application Ser. No. 14/311,723, filed on Jun. 23, 2014, now allowed, which is a continuation of U.S. patent application Ser. No. 12/727,456, filed on Mar. 19, 2010, now U.S. Pat. No. 8,767,171, which is a continuation of U.S. patent application Ser. No. 11/882,292, filed on Jul. 31, 2007, now U.S. Pat. No. 7,710,541, which is a continuation of U.S. patent application Ser. No. 10/743,271 filed Dec. 23, 2003, now U.S. Pat. No. 7,394,521, the entire contents of the foregoing applications herein fully incorporated by reference.

FIELD

The present invention relates to a lithographic apparatus, a device manufacturing method and device manufactured thereby.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
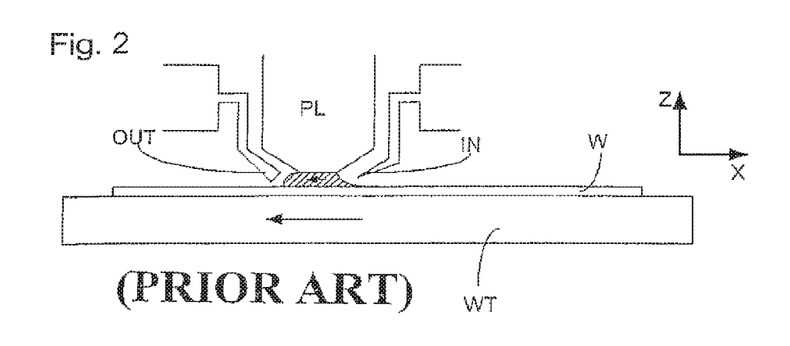
FIG. 2 illustrates, in cross-section, a liquid supply system of the prior art.
Figure 3:
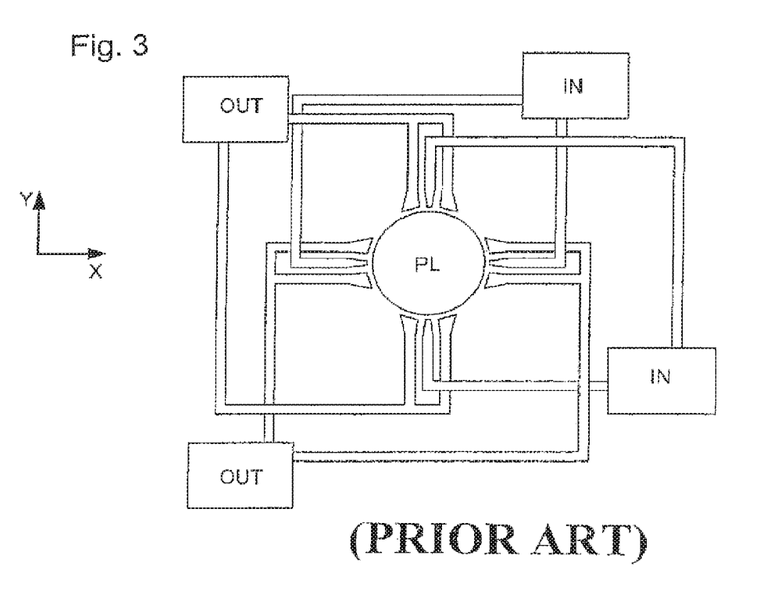
FIG. 3 illustrates, in plan, the liquid supply system of FIG. 2.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In addition to the solution described above, a liquid supply system in a second solution may be provided that comprises a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in U.S. patent application U.S. Ser. No. 10/705,805 and U.S. Ser. No. 10/705,783, both hereby incorporated in their entirety by reference.

A third solution that may be provided comprises a member attached to the projection system which forms a hollow space underneath the final element of the projection system. The bottom of the member is provided close enough to the surface of the substrate such that capillary forces are strong enough to contain the immersion liquid in the hollow space created by the member between the final element of the projection system and the substrate.

While all of the above localized area solutions overcome the problem of needing to accelerate a large body of liquid, each of the solutions may be improved. For example, the first solution has proved to be hard to implement without large and uncontrolled liquid spillage. A further example is that the second and third solutions may deleteriously transmit disturbance forces to the substrate and/or projection system because of their close interaction with the surface of the substrate which is necessary in order to keep the liquid in the space. Furthermore, each of the solutions may not be particularly well suited for imaging objects of different height on the substrate table, such as through lens sensors. There is not a great deal of available space with these systems between the projection system and the substrate and building a liquid supply system which can operate at high NA can be difficult. Each of the solutions may present difficulties with the imaging of edge portions of the substrate, such as the gas seal may become unbalanced when it is partly positioned over the edge of the substrate and/or the capillary force can be lost when imaging edge portions. These solutions all work best with a low free working distance (which would advantageously be higher) and with high fluid pressures (which would advantageously be lower).

Accordingly, it would be advantageous, for example, to provide immersion liquid to a space between a projection system and the substrate without some or all of the above problems, in particular avoiding significant transmission of disturbance forces to the substrate.

According to an aspect, there is provided a lithographic apparatus comprising:

an illumination system configured to provide a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate; and a liquid supply system configured to provide an immersion liquid to a space between the substrate and the projection system, the liquid supply system comprising a barrier member extending along at least a part of the boundary of the space and being in a position relative to an object on the substrate table so that any capillary pressure generated by the immersion liquid between the barrier member and the object is not large enough to constrain the immersion liquid in the space, wherein no seal is provided between the barrier member and the object.

In this way, in use, the immersion liquid is allowed to leak out of the space between the bottom of the barrier member and the substrate and is thereby not constrained in the space. Thus, the transmission of disturbance forces between the projection system, the barrier member and the substrate may be reduced or minimized. Furthermore, a high rate of liquid replenishment in the space may be possible without the necessity for the use of high liquid pressures. The force in the direction of the optical axis on the substrate table may also be reduced and be more constant in comparison to other liquid supply systems. Also, unlike with other supply systems, the imaging of edge portions may become easier as complicated measures are not necessary as the barrier member passes over the edge of the substrate as there is no seal to be disturbed at the edge of the substrate. The simplicity of the barrier member may be increased as only liquid inlets are required and no gas supplies. The lack of gas supplies means that the chance of bubble formation in the immersion liquid which can deleteriously affect the imaging quality may be reduced or minimized. Finally, a larger free working distance (the distance between the projection system and the substrate) may be increased compared to other supply systems.

In an embodiment, the apparatus further comprises at least one outlet to remove immersion liquid, the outlet being radially outwardly of the barrier member. In this way immersion liquid which has spilled from the localized area of the supply system (i.e. the area under the projection system) may be collected without adding to the complexity of the barrier member and without substantially transferring disturbance forces to the substrate and/or substrate table. In one embodiment the outlet is on the substrate table.

In an embodiment, the barrier member is mechanically isolated from the projection system so that disturbance forces are not automatically transmitted to the projection system by the barrier member. In an embodiment, the barrier member is connected to a base frame which supports the substrate table and/or a projection system frame which supports the projection system. In an embodiment, the barrier member is free to move in the direction of an optical axis of the projection system.

For flexibility of the system, the apparatus may comprise an actuator configured to adjust the height and/or tilt of the barrier member relative to the substrate.

According to a further aspect, there is provided a device manufacturing method comprising:

providing an immersion liquid to a space between a substrate on a substrate table and a projection system, a barrier member extending along at least a part of the boundary of the space;

allowing immersion liquid to leak between the barrier member and an object on the substrate table by positioning at least one of the barrier member and the object so that any capillary pressure generated by the immersion liquid between the barrier member and the object is not large enough to constrain the immersion liquid in the space; and projecting a patterned beam of radiation onto a target portion of the substrate using the projection system.

According to a further aspect, there is provided a device manufactured according to the above-referenced device manufacturing method and/or by the above-referenced lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
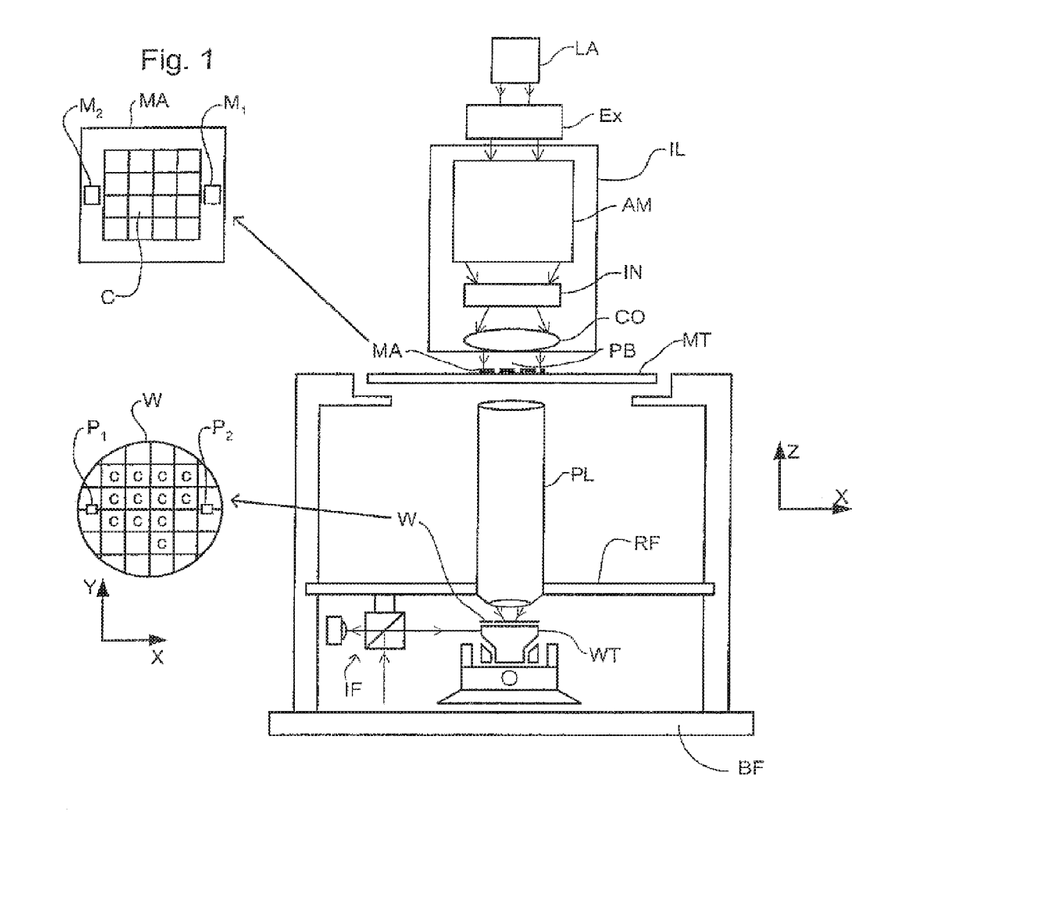
FIG. 1 depicts a lithographic apparatus according to an embodiment of the invention.

FIG. 1 schematically depicts a lithographic apparatus according to a particular embodiment of the invention. The apparatus comprises:
- an illumination system (illuminator) IL for providing a projection beam PB of radiation (e.g. UV radiation);
- a first support structure (e.g. a mask table) MT for supporting a patterning device (e.g. a mask) MA and connected to a first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 4:
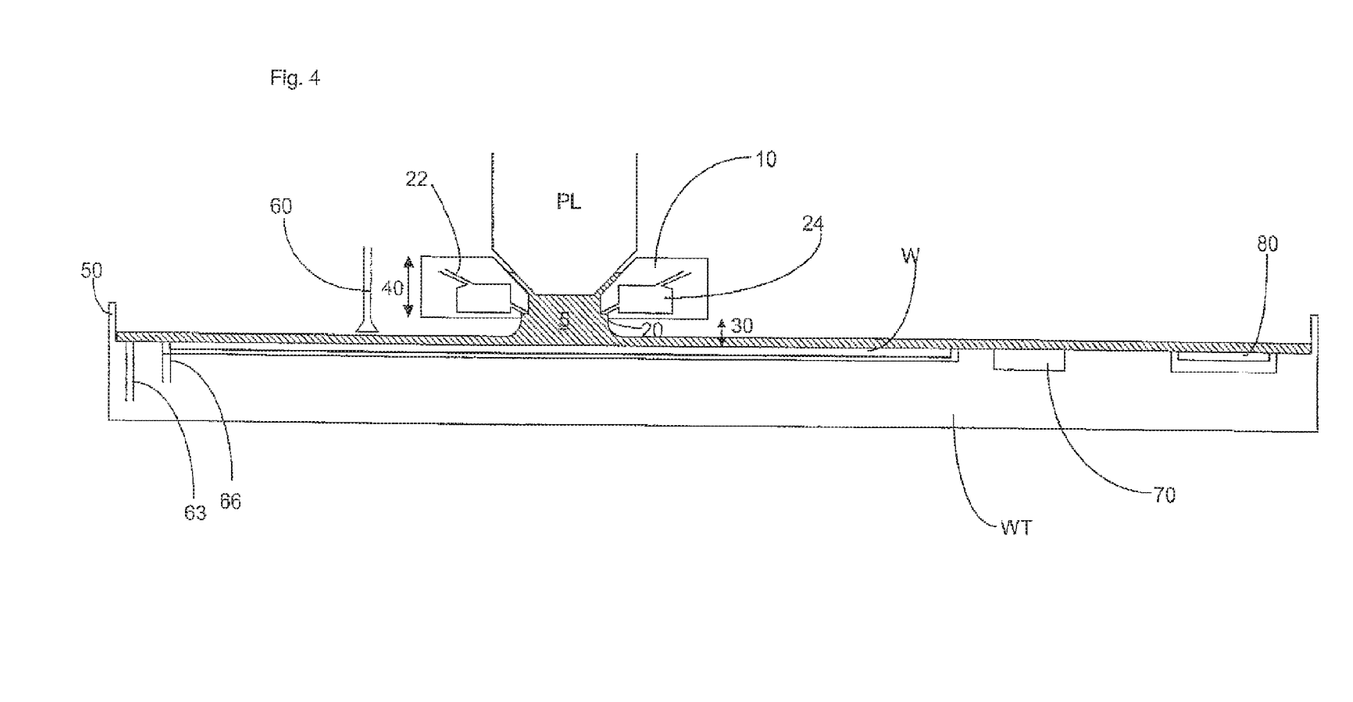
FIG. 4 illustrates the liquid supply system according to an embodiment of the present invention.

FIG. 4 shows a liquid supply system according to an embodiment of the present invention. The liquid supply system comprises a barrier member 10. The barrier member 10 surrounds the final element of the projection system PL. The barrier member 10 extends along at least part of the boundary of a space between the final element of the projection system PL and the substrate W. The space generally bounded by the projection system PL, the barrier member 10 and the substrate W is filled with an immersion liquid 5.

There is no seal between the barrier member 10 and the substrate W. The barrier member 10 is far enough above the substrate W such that capillary forces do not act to contain the immersion liquid 5 in the space between the final element of the projection system PL and the substrate W bounded by the barrier member 10; in use, such as during scanning or stepping, immersion liquid 5 flows out under the barrier member 10 as illustrated because any capillary pressure generated in the gap between the bottom of the barrier member 10 and the top of the substrate W is not large enough to contain the liquid. The barrier member 10 may be connected to the base frame BF, the projection system frame RF and/or another frame. In an embodiment, the barrier member 10 is mechanically isolated from the projection system PL so that disturbances forces imparted on or generated by the barrier member 10 can be prevented or at least limited from being transmitted to the projection system PL.

No provision is made, for example, during scanning, to seal the space 5 to avoid loss of immersion liquid. The level of immersion liquid in the passage between the projection system PL and the barrier member 10 is maintained as constant as possible by the provision of immersion liquid through one or more inlet ports 20.

The barrier member 10 may be comprised solely of the one or more inlet ports 20 so that the arrangement is similar to that shown in FIG. 3 except the outlet ports OUT are inlet ports. Thus, the one or more inlet ports 20 are positioned circumferentially around the optical axis of the apparatus.

Immersion liquid 5 is provided to the space through the one or more inlet ports 20 which is/are formed on a bottom inner edge of the generally annular shaped barrier member 10. The barrier member 10 may be other shapes whether closed (e.g., rectangular) or open (e.g., U-shaped). A chamber 24 provided between the one or more inlet ports 20 and the supply of immersion liquid 22, ensures that immersion liquid is provided into the space at an even pressure around the inner periphery of the barrier member 10 even though the sources of immersion liquid may be provided via one or more discrete channels 22 (as opposed to, for example, a continuous groove). The one or more inlet ports 20 may be a continuous groove.

As is illustrated in FIG. 4, the barrier member 10 extends below the one or more inlet ports 20 radially outwardly of the one or more inlet ports 20, whereas radially inwardly the barrier member 10 is further displaced from the substrate W than on the other side of the one or more inlet ports 20. This design reduces the chance of gas inclusion at the one or more inlet ports 20.

In order to avoid significant capillary forces being generated by immersion liquid 5 filling the gap between the bottom of the barrier member 10 and the top of the substrate W, the bottom of the barrier member is, in an embodiment, at least 50 μm from the substrate W. In an embodiment, the distance 30 is substantially 100 μm or substantially 150 μm. A distance 30 of over 300 μm (even 400 μm) may not be uncommon, for instance during scanning of sensors 70. These are typical distances if the immersion liquid is water. The required distance may be different for other liquids. The barrier member 10 may be moveable in the Z axis 40 such that the distance 30 between the substrate W (or any other object) and the barrier member 10 can be adjusted. The barrier member may also be moveable about one or more axes substantially perpendicular to the Z axis 40 such that the tilt between the substrate W (or any other object) and the barrier member 10 can be adjusted. Alternatively or in addition, the substrate table WT may be moveable in the Z axis 40 to adjust the distance 30 between the substrate W (or any other object) and the barrier member 10 and/or moveable about one or more axes substantially perpendicular to the Z axis 40 to adjust a tilt between the substrate W (or any other object) and the barrier member 10.

Therefore, in use, the immersion liquid is spilt radially outwardly of the barrier member 10 and flows on the substrate (or object (e.g. substrate table WT)) and immersion liquid can be provided through the one or more inlet ports 20 at a low pressure. If the immersion liquid is water, a pressure of about 1000 Pa in the one or more inlet ports 20 is about right and with a suitable restriction between the supply channel and the containment under the projection system, a pressure of about 100 Pa can be achieved under the projection system. Thus, a small constant Z force on the substrate table WT is provided of about 50 mN.

In order to remove the immersion liquid which has been spilled from the liquid supply system, one or more of the outlets 60, 63, 66 may be provided. The outlets are positioned radially outwardly of the barrier member 10 and do not form part of the barrier member 10. Any arrangement can be used for outlets and three possibilities are shown in FIG. 4. A typical outlet 60 might be one which is connected either to the base frame BF or the projection system frame RF (shown in FIG. 1) and which removes liquid from the surface of the substrate W or substrate table WT or a substrate table mounted sensor 70 or a shutter member 80 (described in more detail hereafter). Alternatively or in addition, one or more outlets 63 may be provided in the top surface of the substrate table WT and/or one or more outlets 66 can be provided at the edge of the substrate W. In order to avoid spillage, a rim 50 may be provided around the substrate table WT.

The liquid supply system may be used for imaging of through lens sensors 70 mounted on the substrate table WT as well as with a shutter member 80, which can be attached to the bottom of the barrier member 10 through a vacuum source, by magnets, etc. which ensures that the final element of the projection system PL is maintained wet during substrate W swap. Shutter members are described in more detail in U.S. patent application U.S. Ser. No. 10/705,785, herein incorporated in its entirety by reference. For both the sensors 70 (which may be, for example, transmission image sensors (TIS)) and the shutter member 80, the barrier member 10 may be lowered towards the substrate W (and/or the substrate table WT may be raised towards the barrier member 10). No scanning takes place when the sensors 70 are imaged and during this time (and other times when no scanning takes place) the pressure of liquid in the barrier member 10 can be reduced such that a meniscus can be formed between the barrier member 10 and the substrate table WT so that less liquid escapes as well as perhaps lowering the barrier member 10.

Adaptive height control of the barrier member 10 could be used (see European patent application EP 03256643.2, herein incorporated in its entirety by reference) possibly based on the position of the substrate table WT with respect to the projection system.

In an embodiment, there is provided a lithographic apparatus comprising: an illumination system configured to provide a beam of radiation; a support structure configured to hold a patterning device, the patterning device configured to impart the beam with a pattern in its cross-section; a substrate table configured to hold a substrate; a projection system configured to project the patterned beam onto a target portion of the substrate; and a liquid supply system configured to provide a liquid to a space between the substrate and the projection system, the liquid supply system comprising a barrier member extending along at least a part of the boundary of the space and being in a position relative to an object on the substrate table so that any capillary pressure generated by the liquid between the barrier member and the object is not large enough to constrain the liquid in the space, wherein no seal is provided between the barrier member and the object.

In an embodiment, the apparatus further comprises an outlet to remove liquid, the outlet being radially outwardly of the barrier member. In an embodiment, the outlet is on the substrate table. In an embodiment, the outlet is suspended above the substrate table. In an embodiment, the object comprises the substrate and a distance between the barrier member and the substrate is at least 50 µm. In an embodiment, the object comprises the substrate and a distance between the barrier member and the substrate is one of substantially 100 µm, 150 µm or 300 µm. In an embodiment, the barrier member is mechanically isolated from the projection system. In an embodiment, the barrier member is connected to a base frame that supports the substrate table, or a projection system frame that supports the projection system, or both the base frame and the projection system frame. In an embodiment, the barrier member is free to move in the direction of an optical axis of the projection system. In an embodiment, the apparatus further comprises an actuator configured to adjust a height, or a tilt, or both, of the barrier member relative to the object. In an embodiment, the object comprises the substrate, or a sensor, or a shutter, or any combination of the foregoing. In an embodiment, the barrier member comprises an inlet to supply the liquid to the space.

In an embodiment, there is provided a device manufacturing method comprising: providing a liquid to a space between a substrate on a substrate table and a projection system, a barrier member extending along at least a part of the boundary of the space; allowing liquid to leak between the barrier member and an object on the substrate table by positioning the barrier member, or the object, or both the barrier member and the object, so that any capillary pressure generated by the liquid between the barrier member and the object is not large enough to constrain the liquid in the space; and projecting a patterned beam of radiation onto a target portion of the substrate using the projection system.

In an embodiment, the device manufacturing method comprises removing liquid through an outlet positioned radially outwardly of the barrier member. In an embodiment, the outlet is positioned on the substrate table. In an embodiment, the object comprises the substrate and a distance between the barrier member and the substrate is at least 50 µm. In an embodiment, the barrier member is mechanically isolated from the projection system. In an embodiment, the device manufacturing method comprises moving the barrier member in the direction of an optical axis of the projection system. In an embodiment, the object comprises the substrate, or a sensor, or a shutter, or any combination of the foregoing. In an embodiment, the device manufacturing method comprises supplying the liquid, from the barrier member, to the space.

In an embodiment, there is provided a lithographic apparatus comprising: an illumination system configured to provide a beam of radiation; a support structure configured to hold a patterning device, the patterning device configured to impart the beam with a pattern in its cross-section; a substrate table configured to hold a substrate; a projection system configured to project the patterned beam onto a target portion of the substrate; and a liquid supply system configured to provide a liquid to a space between the substrate and the projection system, the liquid supply system comprising a liquid inlet port provided on a boundary of the space, wherein the liquid is not substantially confined in the space so that liquid can flow out of the space.

In an embodiment, the apparatus further comprises a liquid outlet port, the liquid outlet port being radially outwardly of the liquid inlet port. In an embodiment, the liquid outlet is on the substrate table. In an embodiment, the outlet is suspended above the substrate table. In an embodiment, a distance between a barrier member of the liquid supply system and the substrate is at least 50 µm. In an embodiment, the liquid inlet port is mechanically isolated from the projection system. In an embodiment, the liquid inlet port is connected to a base frame that supports the substrate table, or a projection system frame that supports the projection system, or both the base frame and the projection system frame. In an embodiment, the liquid inlet port is free to move in the direction of an optical axis of the projection system. In an embodiment, the apparatus further comprises an actuator configured to adjust a height, or a tilt, or both, of the liquid inlet port relative to the substrate.

In an embodiment, there is provided a lithographic apparatus comprising: an illumination system configured to provide a beam of radiation; a support structure configured to hold a patterning device, the patterning device configured to impart the beam with a pattern in its cross-section; a substrate table configured to hold a substrate; a projection system configured to project the patterned beam onto a target portion of the substrate; and a liquid supply system configured to provide a liquid to a space between the substrate and the projection system, the liquid supply system comprising a liquid inlet port, wherein a liquid outlet port is provided only on the substrate table, or suspended above the substrate table, or both.

In an embodiment, the liquid outlet port is radially outwardly of the liquid inlet port. In an embodiment, a distance between the liquid inlet port and the substrate is at least 50 µm. In an embodiment, the liquid inlet port is mechanically isolated from the projection system. In an embodiment, the liquid inlet port is connected to a base frame that supports the substrate table, or a projection system frame that supports the projection system, or both the base frame and the projection system frame. In an embodiment, the liquid inlet port is free to move in the direction of an optical axis of the projection system. In an embodiment, the apparatus further comprises an actuator configured to adjust a height, or a tilt, or both, of the liquid inlet port relative to the substrate. In an embodiment, a liquid outlet port is on the substrate table.

While specific embodiments of the invention have been described above, it will be appreciated that the invention may be practiced otherwise than as described. The description is not intended to limit the invention.

The invention claimed is:

1. A lithographic apparatus comprising:
a projection system configured to project a patterned beam onto a target portion of a substrate;
a liquid supply system configured to provide a liquid to a space between the substrate and the projection system, the liquid supply system comprising a liquid inlet port configured to supply the liquid; and
a substrate table configured to hold the substrate, the substrate table comprising:
a support surface configured to support the substrate,
a first fluid outlet opening, located horizontally outward of the support surface, configured to drain at least part of the liquid,
a sensor system component located over an upward-facing surface of the substrate table, the sensor system component located horizontally outward of the first fluid outlet opening, and
a second fluid outlet opening, located horizontally outward of the first fluid outlet opening and the support surface, configured to drain at least part of the liquid,
wherein the liquid inlet port is arranged to be located above the substrate table.

2. The apparatus of claim 1, wherein the second fluid outlet opening is located at an upper surface of the substrate table to drain liquid at the upper surface, and the second fluid outlet opening is arranged to be essentially co-planar with the sensor system component.

3. The apparatus of claim 1, wherein the substrate table comprises a recess to hold the substrate and the first fluid outlet opening is located in the recess.

4. The apparatus of claim 1, wherein the second fluid outlet opening is located at an upper surface of the substrate table to drain fluid at the upper surface, the second fluid outlet opening arranged to be essentially co-planar with the substrate when the substrate is positioned on the substrate table.

5. The apparatus of claim 1, further comprising an actuator configured to adjust a height, or a tilt, or both, of the liquid inlet port relative to the substrate.

6. The apparatus of claim 1, wherein a barrier member surrounds a path of the radiation beam through the space, the liquid inlet port is located on an inner periphery of the barrier member and the liquid inlet port is located below a bottom surface of the projection system.

7. The apparatus of claim 6, further comprising a fluid outlet port located above the substrate table, the fluid outlet port being outward of, and separated from, an outer periphery of the barrier member and configured to remove at least part of the liquid.

8. A lithographic apparatus comprising:
a projection system configured to project a beam of radiation onto a radiation-sensitive portion of a substrate;
a liquid supply system configured to provide a liquid to a space between the substrate and the projection system, the liquid supply system comprising a barrier member extending along at least a part of the boundary of the space, the barrier member comprising a liquid supply port configured to supply liquid to the space; and
a substrate table configured to hold the substrate, the substrate table comprising:
a recess configured to hold the substrate, the recess configured such that a gutter is located between a peripheral edge of the recess and an outer peripheral edge of the substrate when the substrate is positioned in the recess,
a sensor system component located over an upward-facing surface of the substrate table, the sensor system component located horizontally outward of the gutter, and
a fluid outlet opening arranged to be located at a position horizontally outward from the recess, the fluid outlet opening configured to drain at least part of the liquid.

9. The apparatus of claim 8, further comprising a fluid outlet port located in the recess and under the gutter, the fluid outlet port configured to drain at least part of the liquid.

10. The apparatus of claim 8, wherein the fluid outlet opening is located at an upper surface of the substrate table to drain liquid at the upper surface, and the fluid outlet opening, the sensor system component, and the substrate when positioned in the recess, are essentially co-planar.

11. The apparatus of claim 8, wherein the fluid outlet opening is located at an upper surface of the substrate table to drain liquid at the upper surface, and the fluid outlet opening is arranged to be essentially co-planar with the sensor system component.

12. The apparatus of claim 8, wherein the fluid outlet opening is located at an upper surface of the substrate table to drain liquid at the upper surface, the fluid outlet opening arranged to be essentially co-planar with the substrate when the substrate is positioned on the substrate table.

13. The apparatus of claim 8, further comprising a fluid outlet port located above the substrate table, the fluid outlet port being outward of, and separated from, an outer periphery of the barrier member and configured to remove at least part of the liquid.

14. The apparatus of claim 8, wherein the barrier member surrounds a path of the radiation beam through the space, the liquid supply port is located on an inner periphery of the barrier member and the liquid supply port is located below a bottom surface of the projection system.

15. The apparatus of claim 8, further comprising an actuator configured to adjust a height, or a tilt, or both, of the barrier member relative to the substrate.

16. A device manufacturing method comprising:
providing a liquid to a space between a substrate and a projection system using a barrier member extending along at least a part of the boundary of the space, the barrier member comprising a liquid supply port supplying liquid to the space and the substrate held in a recess of substrate table such that a gutter is located between a peripheral edge of the recess and an outer peripheral edge of the substrate;

projecting a beam of radiation, through the liquid in the space, onto a radiation-sensitive portion of the substrate;

causing at least part of the liquid to become located on a sensor system component situated over an upward-facing surface of the substrate table, the sensor system component located horizontally outward of the gutter; and draining at least part of the liquid using a fluid outlet opening located at a position horizontally outward from the recess and the gutter.

17. The method of claim 16, further comprising draining at least part of the liquid entering the gutter using a fluid outlet port located in the recess and under the gutter.

18. The method of claim 16, wherein the fluid outlet opening is located at an upper surface of the substrate table, and the fluid outlet opening, the sensor system component, and the substrate are essentially co-planar.

19. The method of claim 16, wherein the fluid outlet opening is located at an upper surface of the substrate table, and the fluid outlet opening is essentially co-planar with the substrate.

20. The method of claim 16, further comprising removing at least part of the liquid using a fluid outlet port located above the substrate table, the fluid outlet port being outward of, and separated from, an outer periphery of the barrier member.

* * * * *